United States Patent
Loubet et al.

(10) Patent No.: US 9,219,133 B2
(45) Date of Patent: Dec. 22, 2015

(54) METHOD OF MAKING A SEMICONDUCTOR DEVICE USING SPACERS FOR SOURCE/DRAIN CONFINEMENT

(71) Applicant: STMICROELECTRONICS, INC., Coppell, TX (US)

(72) Inventors: Nicolas Loubet, Guilderland, NY (US); Pierre Morin, Albany, NY (US)

(73) Assignee: STMICROELECTRONICS, INC., Coppell, TX (US)

(*) Notice: Subject to any disclaimer, the term of this patent is extended or adjusted under 35 U.S.C. 154(b) by 57 days.

(21) Appl. No.: 13/905,586

(22) Filed: May 30, 2013

(65) Prior Publication Data
US 2014/0357040 A1     Dec. 4, 2014

(51) Int. Cl.
H01L 29/66     (2006.01)
H01L 21/02     (2006.01)
H01L 29/06     (2006.01)

(52) U.S. Cl.
CPC ....... *H01L 29/66795* (2013.01); *H01L 21/0262* (2013.01); *H01L 21/02532* (2013.01); *H01L 21/02576* (2013.01); *H01L 21/02579* (2013.01); *H01L 29/0673* (2013.01); *H01L 29/66439* (2013.01)

(58) Field of Classification Search
CPC .................................................. H01L 29/66795
See application file for complete search history.

(56) References Cited

U.S. PATENT DOCUMENTS

| | | | |
|---|---|---|---|
| 2008/0303114 A1* | 12/2008 | Shibata et al. | 257/495 |
| 2009/0152589 A1* | 6/2009 | Rakshit et al. | 257/190 |
| 2010/0203732 A1 | 8/2010 | Doris et al. | |
| 2012/0142121 A1 | 6/2012 | Khare et al. | |
| 2012/0252174 A1 | 10/2012 | Dutartre et al. | |
| 2013/0052801 A1 | 2/2013 | Berliner et al. | |
| 2013/0115759 A1 | 5/2013 | Park et al. | |

* cited by examiner

*Primary Examiner* — Alexander Ghyka
(74) *Attorney, Agent, or Firm* — Allen, Dyer, Doppelt, Milbrath & Gilchrist, P.A.

(57) ABSTRACT

A method of making a semiconductor device includes forming a first spacer for at least one gate stack on a first semiconductor material layer, and forming a respective second spacer for each of source and drain regions adjacent the at least one gate. Each second spacer has a pair of opposing sidewalls and an end wall coupled thereto. The method includes filling the source and drain regions with a second semiconductor material while the first and second spacers provide confinement.

8 Claims, 8 Drawing Sheets

METHOD OF MAKING A SEMICONDUCTOR DEVICE USING SPACERS FOR SOURCE/DRAIN CONFINEMENT

FIELD OF THE INVENTION

The present invention relates to electronics, and more particularly, to a method of making semiconductor devices.

BACKGROUND OF THE INVENTION

Semiconductor device technologies continue to evolve, providing higher chip density and operating frequencies. Fin-type field-effect transistors (FinFETs) are one type of transistor technology that is currently used to help provide desired device scaling while maintaining appropriate power consumption budgets.

This fin-type field effect transistor (FinFET) is a transistor that is formed within a fin of material. A fin is a relatively narrow width, relatively tall height structure that protrudes from the top surface of a substrate. The fin width is intentionally kept small to limit the short channel effect. In many FinFet's, a fin cap is positioned on the top of the fin and runs along the fin length. The fin cap has a fin cap width equal to the fin width, and fin cap height that is less than the fin height.

In a conventional FinFET, a gate conductor is positioned on the top surface of the substrate and over a portion of the fin. The gate conductor runs parallel to the top of the substrate and is perpendicular to the fin length such that the gate conductor intersects a portion of the fin. An insulator (e.g., gate oxide) separates the gate conductor from the fin and the fin cap. Further, the region of the fin that is positioned below the gate conductor comprises a semiconductor channel region. The FinFET structure can include multiple fins and fin caps, in which case the gate conductor would wrap around, as well as fill in, the space between these fins.

During FinFET formation, source and drain recesses are formed and typically require additional cleanings to have epitaxial regrowth above the fin at the source and drain regions. Some epitaxial junctions formed by this epitaxial regrowth are stressed. During manufacture, it is difficult to make a uniform fin recess dimension when multiple fins are used and epitaxial junctions are stressed. Also, during manufacture, the fin profile is often rounded and the fin surface is damaged by aggressive reactive ion etching (RIE) after spacer formation, and during in-situ doped epitaxy. These factors may impact adversely transistor functionality.

SUMMARY OF THE INVENTION

A method of making a semiconductor device comprises forming a first spacer for at least one gate stack on a first semiconductor material layer. The method further comprises forming a respective second spacer for each of source and drain regions in the first semiconductor layer and adjacent the at least one gate, with each second spacer comprising a pair of opposing side walls and an end wall coupled thereto. The method further comprises filling the source and drain regions with a second semiconductor material while the first and second spacers provide confinement.

The method may comprise etching source and drain recesses adjacent the at least one gate stack prior to filling. The etching and filling may be performed in a same processing chamber, for example. In another example, the method may comprise shaping the source and drain regions to have an inclined extension adjacent the at least one gate stack. The first and second spacers may comprise a nitride, such as SiN, for example.

The first and second semiconductor materials may be formed of different semiconductor materials so that stress is imparted to a channel region under the at least one gate stack. The first semiconductor material may comprise silicon, and the second semiconductor material may comprise silicon and germanium. The first semiconductor layer comprises a silicon on insulator (SOI) wafer. The method may further comprise forming a plurality of fins, and forming the second spacers on outer surfaces of the fins and adjacent the at least one gate stack. The fins are etched to form source and drain recesses in an example.

BRIEF DESCRIPTION OF THE DRAWINGS

Other features and advantages of the present invention will become apparent from the detailed description of the invention which follows, when considered in light of the accompanying drawings in which.

DETAILED DESCRIPTION OF THE EMBODIMENTS

Different embodiments will now be described more fully hereinafter with reference to the accompanying drawings, in which preferred embodiments are shown. Many different forms should not be construed as limited to the embodiments set forth herein. Rather, these embodiments are provided so that this disclosure will be thorough and complete, and will fully convey the scope to those skilled in the art.

Figure 1:
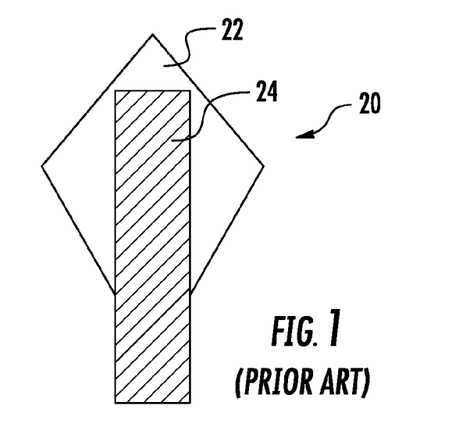
FIG. 1 is a fragmentary diagram of a prior art FinFET structures showing an embedded epitaxial area adjacent the fin as in the prior art.
Figure 2:
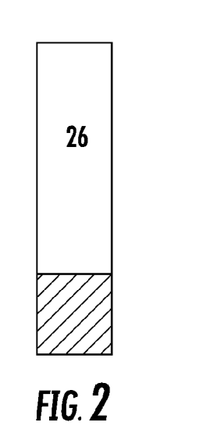
FIGS. 2 and 3 are fragmentary diagrams of a FinFET device showing embedded epitaxial source and drain regions as in the present invention.
Figure 3:
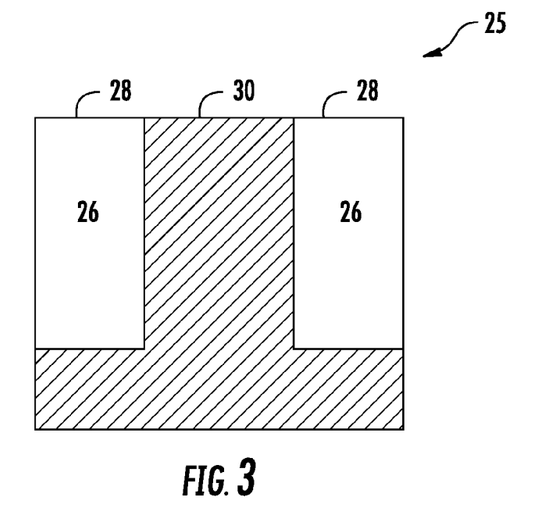

FIG. 1 is fragmentary diagram of a prior art semiconductor device as a FinFET structure 20 that includes an epitaxial regrowth 22 above the fin 24. This type of device may be limited in performance. In contrast, FIGS. 2 and 3 illustrate a modified FinFET structure 25, where device functionality is enhanced by embedding an epitaxial regrowth 26 into the fin source and drain regions 28 after etching along the fin 30. The embedded epitaxial junctions may be potentially stressed when fins are formed by partial anisotropic reactive ion beam (RIE) etching after spacer formation, followed by in-situ doped epitaxy. The epitaxial material may be either n-type or p-type doped silicon, or silicon germanium (SiGe), or silicon carbon (SiC), for imparting stress and enhanced mobility. SiGe is used for compressive stress of a channel (pFET), while SiC is used for tensile stress for nFET transistor improvements.

Figure 4:
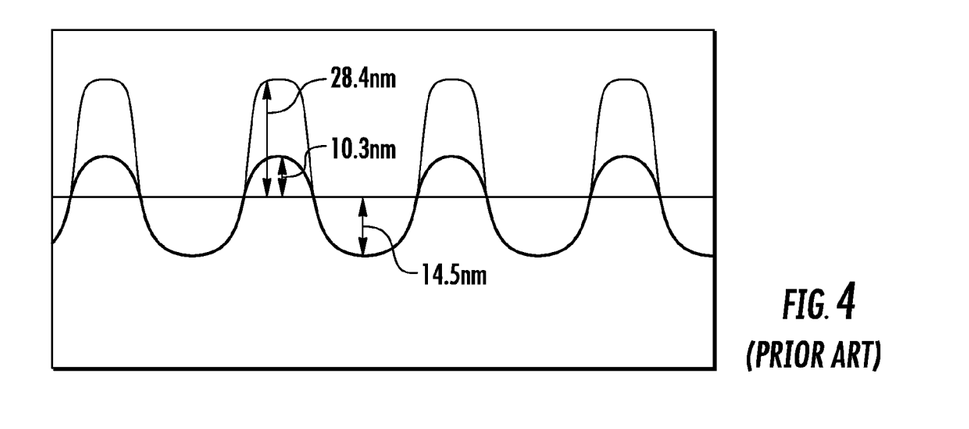
FIG. 4 is a graph showing a fin profile in an example FinFET device as in the prior art.

FIG. 4 shows a sectional view of an image of an example FinFET device showing the pitch-to-pitch profile and relative dimensions of the FinFET profile as a non-limiting example. The profile shown in FIG. 4 is a prior art example of a rounded fin profile that may have been damaged, such as by aggressive reactive ion etching processes, requiring additional cleaning of the surfaces.

It may be difficult to have a uniform fin, pitch-to-pitch profile when fins are rounded and a fin surface has been damaged by aggressive reactive ion beam etching processes, thereby requiring additional processing and cleaning to make the surface cleaner prior to epitaxial regrowth. The fin also may have been recessed outside the spacers and additional implants may be needed to build the junctions as extensions.

A method in accordance with a non-limiting example of the present embodiments overcomes these disadvantages and provides epitaxial source and drain regions that are formed by in-situ HCL (hydrochloric acid) etching of at least one silicon fin, followed by epitaxial regrowth of the in-situ doped Si, SiGe, or SiC. SiN spacers can confine the stressor material as an epitaxial material and minimize subsequent doping dose losses. For that reason, implants may not be needed. The HCL etch process is more isotropic and a good profile containing the (111) facet (plane) is achieved for maximum stress and device improvement.

The method in accordance with a non-limiting example of the present embodiments has advantages such as limiting damage of the fin during recess etching. This processing may be accomplished in-situ in a clean environment and a single processing tool may be used, such as an epitaxial reactor in one non-limiting example. There may be no requirements for additional cleanings after recess formation. The chemically pure surface leads to excellent crystalline quality of the grown layer, such as any SiGe or SiC layers. There is no epitaxial overgrowth 22 as shown in the prior art device of FIG. 1 because material is confined by the SiN spacer material in all directions, forming a square configuration as illustrated in FIGS. 2 and 3. There may be no need for additional implants that would reduce the stress and damage the silicon. Also, junctions may be engineered directly via in-situ doped epitaxy. Dopants may be boron, phosphorous, arsenic and other similar dopants depending on the type of transistor, such as nFET or pFET.

FIGS. 5-13 illustrate a method of forming a semiconductor device, such as a FinFET, in accordance with a non-limiting example with FIGS. 5-7 and 11 showing various isometric views in different stages of processing and FIGS. 8-10 and 12 showing cross-sectional views during different stages of processing.

Figure 5:
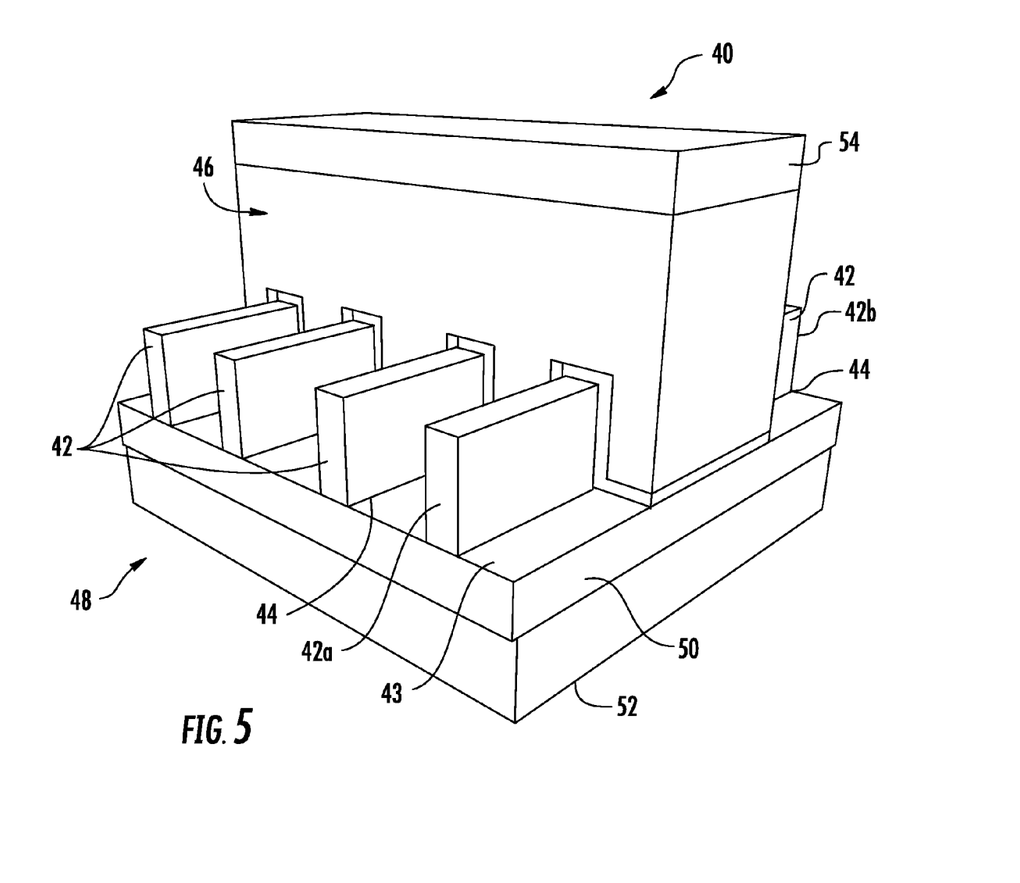
FIG. 5 is a perspective view of a semiconductor device as a FinFET device in accordance with a non-limiting example of the present invention and showing a first processing step of patterning and etching to form silicon fins.

FIG. 5 is an isometric view of a semiconductor device as a FinFET device illustrated generally at 40 in a first stage of processing and showing a plurality of semiconductor fins 42 extending upwardly from a first semiconductor material layer 43 as a substrate and being spaced apart along the substrate. Each semiconductor fin has opposing first and second ends 42a, 42b and forming respective source and drain regions 44 and a medial portion therebetween. At least one gate stack 46 is formed over the medial portions of the semiconductor fins 42 on the first semiconductor material layer. In one example, the first semiconductor layer is formed as a silicon on insulator (SOI) wafer 48 with a $SiO_2$ layer 50 over a silicon substrate 52 as illustrated. A hard mask 54 protects the top surface of the gate stack 46 and comprises a silicon nitride material, and in one example, is 30 nm (nanometers) thick.

Figure 6:
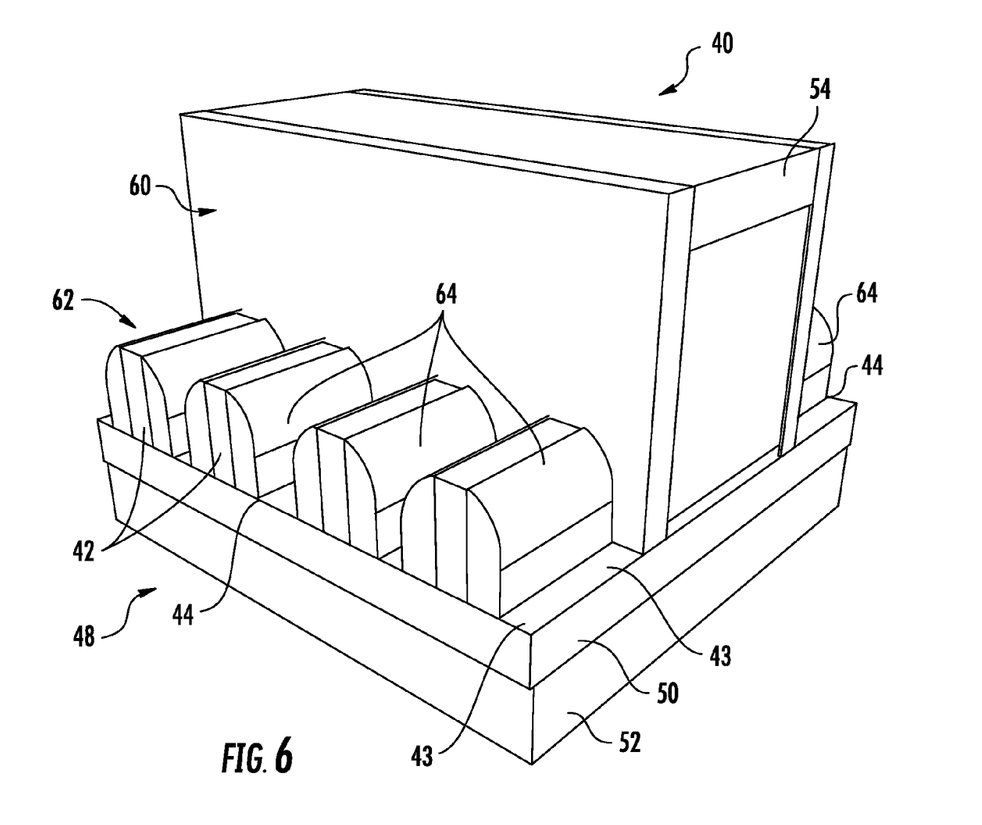
FIG. 6 is another perspective view similar to FIG. 5 and showing a second processing step of forming first and second SiN spacers, including each of source and drain regions and on outer surfaces of each semiconductor fin.
Figure 8:
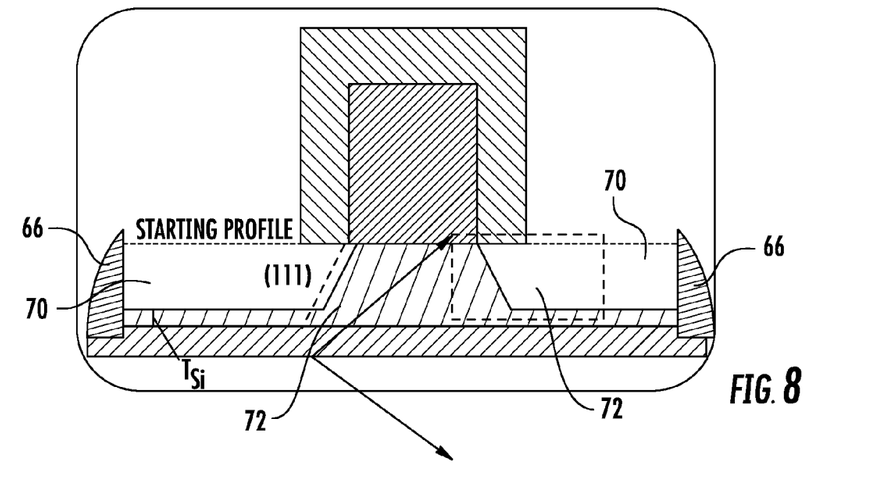
FIG. 8 is a cross-sectional view taken along line 8-8 of FIG. 7 and showing the profile of source and drain recesses after etching.

FIG. 6 shows a further processing step of applying a first SiN spacer 60 for the at least one gate stack 46 on the first semiconductor material layer 43 and a second respective SiN spacer 62 for each of the source and drain regions 44 in the first semiconductor material layer 43 and adjacent the at least one gate with each second SiN spacer comprising a pair of opposing sidewalls 64 and an end wall 66 shown in FIG. 8 coupled thereto.

Figure 7:
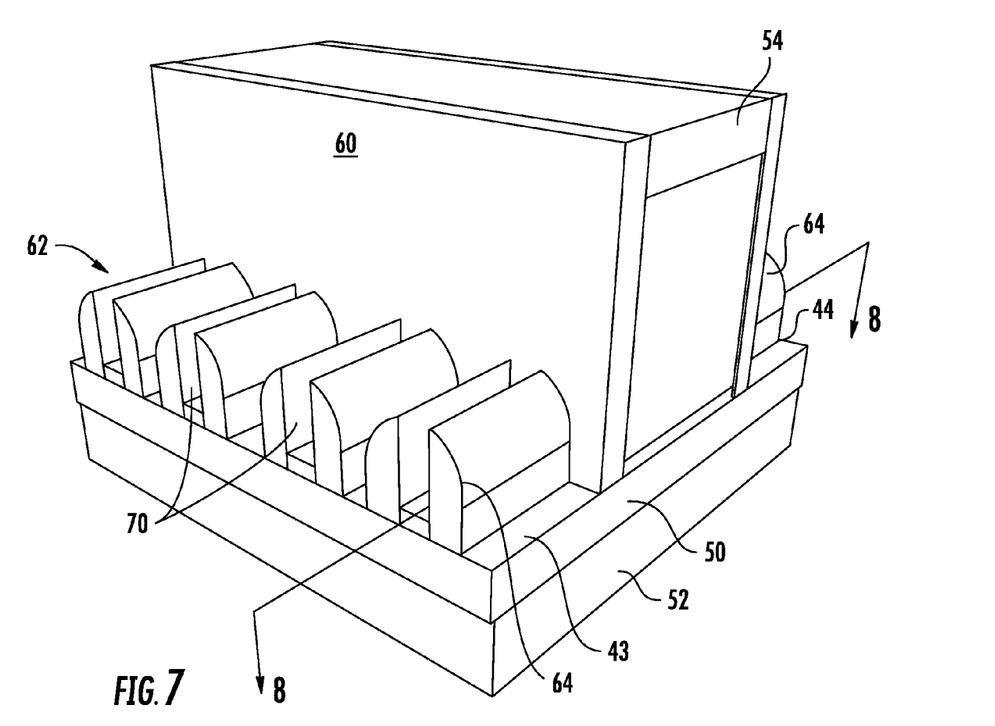
FIG. 7 is another perspective view showing a third processing step of etching the silicon fins to form source and drain recesses at the respective source and drain regions.

FIG. 7 shows a further processing step in which the silicon fins 42 are etched with a vapor phase HCL in one example to form source and drain recesses 70 adjacent the at least one gate stack 46 at each of the source and drain regions 44 as illustrated.

Figure 9:
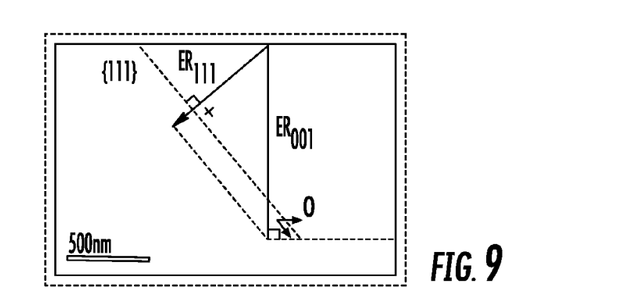
FIG. 9 is a sectional image of the inclined extension shown by the area of the dashed lines in FIG. 8 and showing the facet (plane) profile and respective angles.
Figure 10:
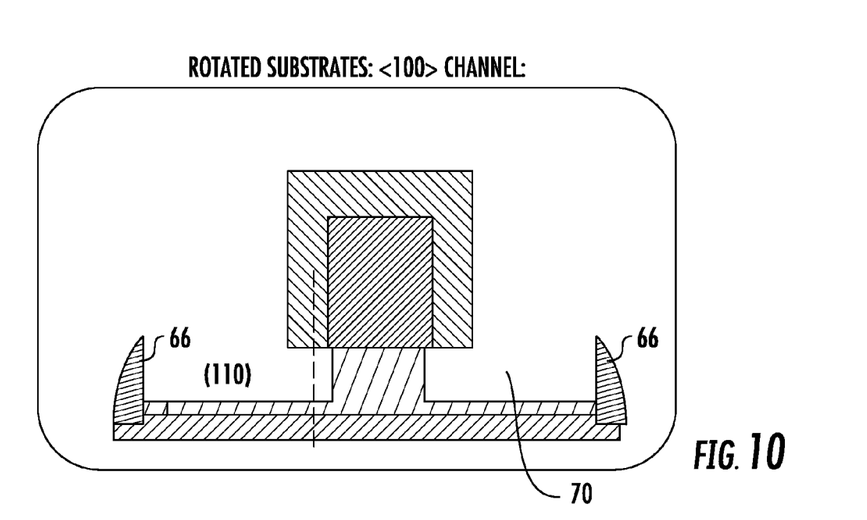
FIG. 10 is another cross-sectional view similar to FIG. 8 but showing the substrate rotated.

FIG. 8 is a cross-sectional view taken along line 8-8 of FIG. 7 and shows the fin profile after the HCL etching to form the source and drain recesses 70. The source and drain recesses 70 have an inclined extension 72 adjacent the at least one gate stack 46 as shown in FIG. 8 and in the image of FIG. 9, shows the profile while FIG. 10 showing the rotated substrate in which the (110) facet (plane) is present instead of the (111) facet (plane) as in FIGS. 8 and 9.

After the HCL etching, there is a (100)-(111) facet (plane) profile. Maximum stress is expected and the inclined extension 72 is formed at an angle from normal to the first semiconductor material 43 layer in a range from 30-60°. In one example, the (111) facet (plane) forms a 54° angle with the (100) facet (plane) as the vertical plane. The etch rate for the various facets (planes) may be adjusted using temperature and pressure processing. In FIG. 8, the $T_{SI}$ (top surface imaging) is greater than 2 nm (nanometers) for good epitaxial regrowth. FIG. 9 shows the dimension scale at 500 nm (nanometers).

Figure 11:
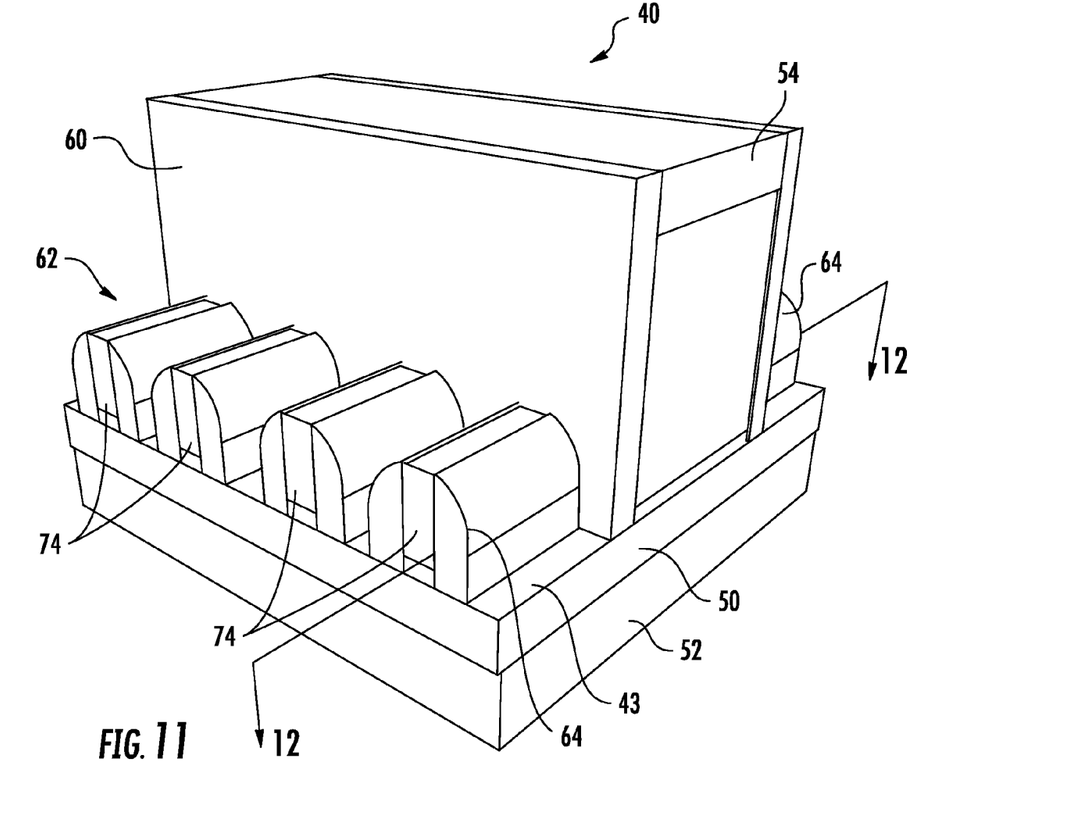
FIG. 11 is another perspective view showing a fourth processing step and the source and drain recesses filled with a second semiconductor material and where the first SiN spacer and second SiN spacer provide confinement during filling.

FIG. 11 is another isometric view showing the source and drain recesses 70 filled with the second semiconductor material 74 so that the first and second SiN spacers 60, 62 provide confinement during filling, such as the epitaxial material filling.

Figure 12:
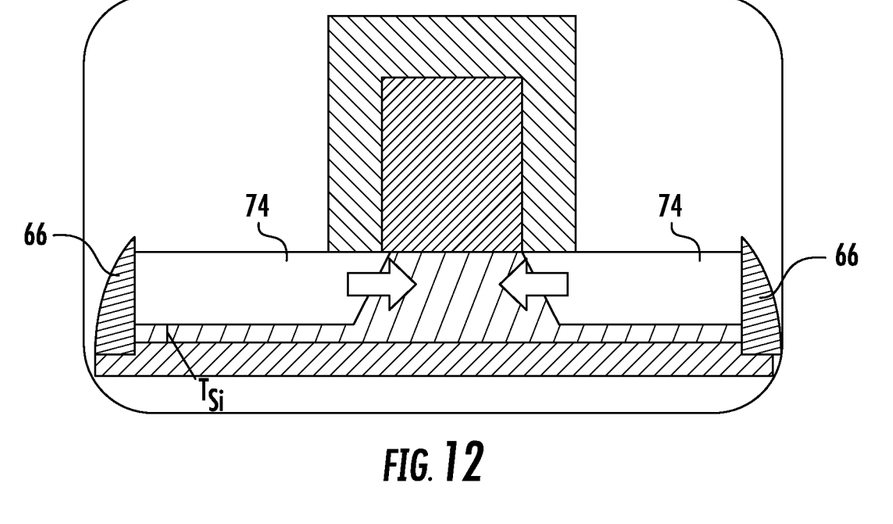
FIG. 12 is a cross-sectional view taken along line 12-12 in FIG. 11 and showing the inclined extension adjacent the at least one gate stack at source and drain regions.

FIG. 12 is a sectional view taken along line 12-12 of FIG. 11 and showing the source and drain regions 44 adjacent the at least one gate stack 46 filled with the second semiconductor material 74, which in one example, is a silicon germanium boron (SiGe)B. The etching and epitaxial growth is performed in the same processing chamber as an epitaxial reactor in a non-limiting example. The crystalline quality of the crystal, whether SiGe or SiC, provides a pure surface with the epitaxial growth imparting in one example compressive strain as indicated by the arrows in FIG. 12 and confined by the nitride spacers 60, 62 in all directions. The filler epitaxial material forms an extension that can be engineered by the epitaxial growth. In an example, an in-situ doped epitaxy is used for junction engineering with multilayers of SiGeC:B/SiGe:B possible to maximize strain while maintaining good transistor electrostatics.

Shape creation for the source and drain recesses 70 occurs in the same processing chamber, for example, the epitaxial reactor. The wafer is loaded and the epitaxial reactor is set for depth and an etch temperature processing between 650° to 800° C. in one non-limiting example and at a pressure from 5 TORR to about 500 TORR. Deposition occurs with Si, SiGe, SiC and other precursors: Silicon Dichlorosilane SiH2Cl2 (as the silicon precursor), Germanium Germane (GeH4), and Carbon Methylsilane (CH3-SiH3). Doping may occur with Boron Diborane (B2H6), Phosphorous Phosphine (PH3), and Arsenic Arsine (ASH3).

Etching may occur with HCL (Hydrochloric Acid) at a flow from 100 SCCM (standard cubic centimeters per minute) to 20 SLM (standard liters per minute) to shape the source and drain recesses 70 and form the inclined extension 72 adjacent the gate stack 46 such as shown in FIG. 8.

The epitaxially deposited layer is typically Silicon Germanium with the germanium content ranging from about 25% to about 60% to impart stress. The same range of pressures may be applied in the same processing chamber as an epitaxy reactor with the pressures ranging from about 5 TORR to about 500 TORR and the temperature ranging from about 500° C. to about 800° C. Deposition may occur with Si, SiGe precursors as noted before and doping may occur with the same dopants as noted before.

Figure 13:
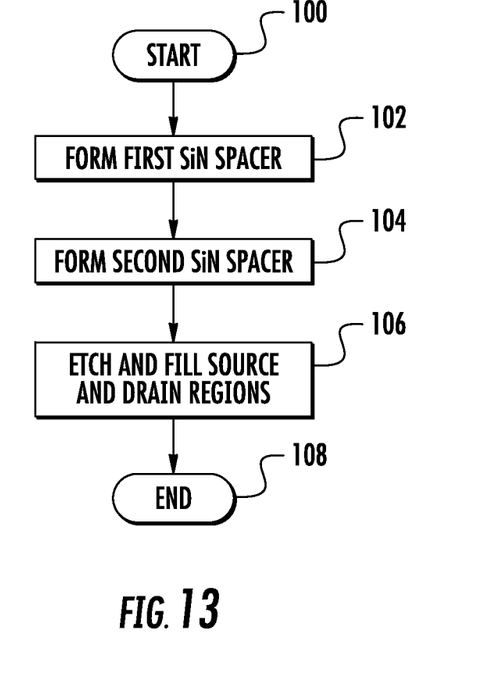
FIG. 13 is a flowchart illustrating a method for making the semiconductor device in accordance with a non-limiting example of the present invention.

FIG. 13 illustrates a high-level flowchart showing basic sequence steps. The process starts (block 100) and a first SiN spacer is formed (block 102) such as for at least one gate stack on a first semiconductor material layer. A respective second SiN spacer is formed (block 104) such as for each of source and drain regions in the first semiconductor layer and adjacent the at least one gate. The second SiN spacer is formed as a pair of opposing sidewalls and an end wall coupled thereto. The source and drain regions are filled with the second semiconductor material (block 106) such that the first SiN spacer and second SiN spacer provide confinement during filling. The process ends at block 108.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making a semiconductor device comprising:
   forming a first spacer for at least one gate stack on a first semiconductor material layer;
   forming a respective second spacer for each of source and drain regions in the first semiconductor layer and adjacent the at least one gate stack, each second spacer comprising a pair of opposing sidewalls and an end wall coupled thereto;
   forming at least one fin for each pair of source and drain regions;
   etching the at least one fin for each pair of source and drain regions to form source and drain recesses;
   shaping the source and drain recesses to have an inclined extension adjacent the at least one gate stack; and
   filling the source and drain recesses with a second semiconductor material while the first and second spacers provide confinement.

2. The method according to claim 1, wherein the etching and filling are performed in a same processing chamber.

3. The method according to claim 1, wherein the first and second spacers comprise a nitride.

4. The method according to claim 1, wherein the first and second semiconductor materials are different semiconductor materials so that a stress is imparted to a channel region under the at least one gate stack.

5. The method according to claim 4, wherein the first semiconductor material comprises silicon, and the second semiconductor material comprises silicon and germanium.

6. The method according to claim 1, wherein the first semiconductor layer comprises a silicon on insulator (SOI) wafer.

7. A method of making a semiconductor device comprising:
   forming a first nitride spacer for at least one gate stack on a first semiconductor material layer;
   forming a respective second nitride spacer for each of source and drain regions in the first semiconductor layer and adjacent the at least one gate stack, each second nitride spacer comprising a pair of opposing sidewalls and an end wall coupled thereto;
   forming at least one fin for each pair of source and drain regions;
   etching the at least one fin for each pair of source and drain regions to form source and drain recesses;
   shaping the source and drain recesses to have an inclined extension adjacent the at least one gate stack; and
   filling the source and drain recesses with a second semiconductor material while the first and second nitride spacers provide confinement.

8. The method according to claim 7, wherein the etching and filling are performed in a same processing chamber.

* * * * *